US012733165B2

(12) United States Patent
Shigeno

(10) Patent No.: US 12,733,165 B2
(45) Date of Patent: Sep. 8, 2026

(54) SEMICONDUCTOR DEVICE AND METHOD OF MANUFACTURING THE SAME

(71) Applicant: Kioxia Corporation, Tokyo (JP)

(72) Inventor: Chieko Shigeno, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 936 days.

(21) Appl. No.: 17/830,978

(22) Filed: Jun. 2, 2022

(65) Prior Publication Data

US 2023/0189522 A1 Jun. 15, 2023

(30) Foreign Application Priority Data

Dec. 10, 2021 (JP) ................................ 2021-200961

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS 8,072,024 B2 12/2011 Ishikawa et al.
8,614,510 B2 12/2013 Tomizawa et al.
9,396,954 B2 7/2016 Cho et al.
9,997,530 B2 * 6/2018 Yon ........................ H10B 43/27
10,074,667 B1 9/2018 Higashi et al.
2017/0077134 A1 3/2017 Taguchi
2020/0295035 A1 * 9/2020 Sawa ..................... H10B 41/10
2020/0295201 A1 * 9/2020 Noguchi ............ H10D 30/6891
2021/0296347 A1 * 9/2021 Saito ...................... H10B 43/30
2023/0084292 A1 * 3/2023 Suzuki ................ H10D 30/701
365/145

FOREIGN PATENT DOCUMENTS

JP 9-260369 A 10/1997
JP 2009-277770 A 11/2009
JP 2010-225682 A 10/2010
JP 5836431 B2 12/2015
JP 2018-152419 A 9/2018
JP 2021-34720 A 3/2021

* cited by examiner

*Primary Examiner* — Marlon T Fletcher
*Assistant Examiner* — Da Wei Lee
(74) *Attorney, Agent, or Firm* — Oblon, McClelland, Maier & Neustadt, L.L.P.

(57) ABSTRACT

In one embodiment, a semiconductor device includes a substrate, and a stacked film including a plurality of first layers and a plurality of second layers alternately provided on the substrate. The device further includes a charge storage layer provided on a side face of the stacked film via a first insulator, and a semiconductor layer provided on a side face of the charge storage layer via a second insulator. Furthermore, one of the plurality of first layers includes a first region that includes carbon having a first concentration, and a second region that includes carbon having a second concentration higher than the first concentration, and includes a lower side region provided on a lower side of the first region or an upper side region provided on an upper side of the first region.

26 Claims, 17 Drawing Sheets

| INCREASE OF C CONCENTRATION | |
|---|---|
| HF | ↘ |
| LF | ↗ |
| PRESSURE | ↘ |
| SILANE | ↘ |
| Ar | ↗ |
| $N_2$ | ↘ |
| $CO_2$ | ↘ |

12
11
8c
8a
8b
8
1
2
3
4
5
5a
5b
H1
H2
6b
6a
6
7
9

Z
Y
X

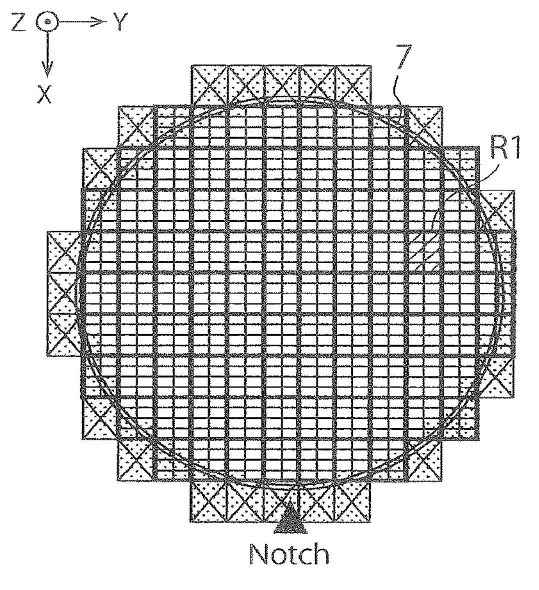
FIG. 16A
Z Y X
R1
R2
FIG. 16B
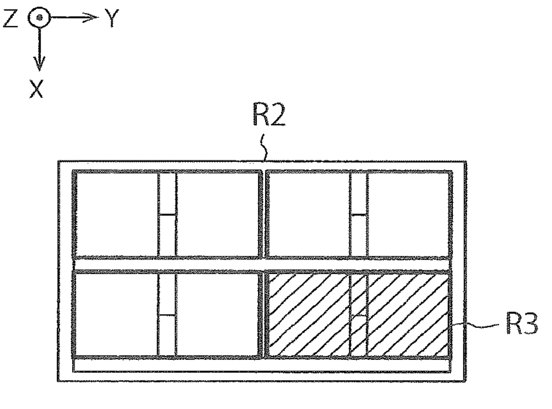
FIG. 16C
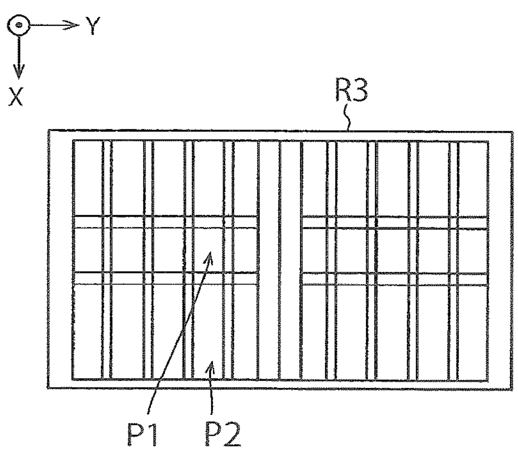
FIG. 16D

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-200961, filed on Dec. 10, 2021, the entire contents of which are incorporated herein by reference.

FIELD

Embodiments described herein relate to a semiconductor device and a method of manufacturing the same.

BACKGROUND

A semiconductor device may include a stacked film including a plurality of layers, for example, a stacked film including a plurality of insulating layers and a plurality of electrode layers alternately, or a stacked films including a plurality of insulating layers and a plurality of sacrificial layers alternately. In such a case, the shape of the layers in the stacked film may deform, or the etching resistance of the layers in the stacked film may deteriorate.

BRIEF DESCRIPTION OF THE DRAWINGS

FIGS. 16A to 16D are plan views showing details of the method of manufacturing the semiconductor device of the fourth embodiment.

DETAILED DESCRIPTION

Figure 1:
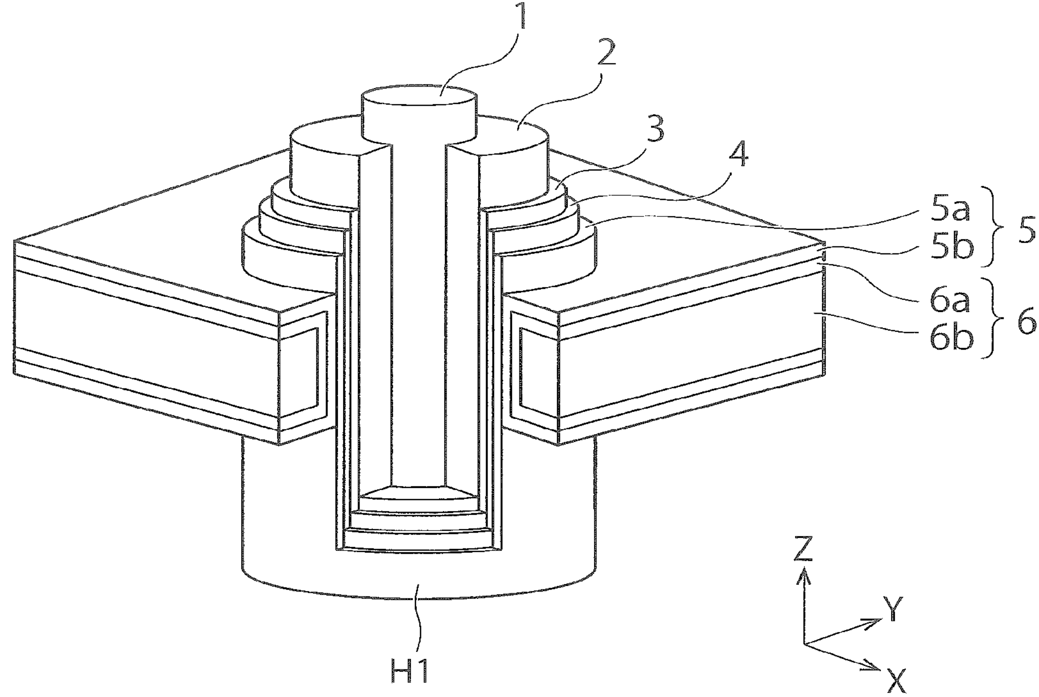
FIG. 1 is a perspective view showing a structure of a semiconductor device of a first embodiment.

Embodiments will now be explained with reference to the accompanying drawings. In FIGS. 1 to 17, the same configurations are designated by the same reference numerals and characters, and duplicate description will be omitted.

In one embodiment, a semiconductor device includes a substrate, and a stacked film including a plurality of first layers and a plurality of second layers alternately provided on the substrate. The device further includes a charge storage layer provided on a side face of the stacked film via a first insulator, and a semiconductor layer provided on a side face of the charge storage layer via a second insulator. Furthermore, one of the plurality of first layers includes a first region that includes carbon having a first concentration, and a second region that includes carbon having a second concentration higher than the first concentration, and includes a lower side region provided on a lower side of the first region or an upper side region provided on an upper side of the first region.

First Embodiment

FIG. 1 is a perspective view showing a structure of a semiconductor device of a first embodiment. The semiconductor device of FIG. 1 includes, for example, a three-dimensional semiconductor memory.

The semiconductor device of FIG. 1 includes a core insulator 1, a channel semiconductor layer 2, a tunnel insulator 3, a charge storage layer 4, block insulators 5, and electrode layers 6. The block insulators 5 include an insulator 5*a* and insulators 5*b*. The electrode layers 6 include barrier metal layers 6*a* and electrode material layers 6*b*. The insulator 5*a*, the tunnel insulator 3, and the channel semiconductor layer 2 are respectively examples of the first insulator, the second insulator, and the semiconductor layer.

In FIG. 1, a plurality of insulating layers and a plurality of electrode layers are alternately stacked on the substrate, and a memory hole H1 is provided in these insulating layers and electrode layers. FIG. 1 shows one electrode layer 6 of these electrode layers. These electrode layers function, for example, as word lines of a three-dimensional semiconductor memory. FIG. 1 shows an X direction and a Y direction parallel to the surface of the substrate and perpendicular to each other, and a Z direction perpendicular to the surface of the substrate. In the present specification, the +Z direction is referred to as an upward direction, and the −Z direction is referred to as a downward direction. The −Z direction may be the same as the gravity direction, or may not be the same as the gravity direction.

The core insulator 1, the channel semiconductor layer 2, the tunnel insulator 3, the charge storage layer 4, and the insulator 5*a* are formed in the memory hole H1 and configure a memory cell of a three-dimensional semiconductor memory. The insulator 5*a* is formed on surfaces of the plurality of insulating layers and the plurality of electrode layers in the memory hole H1, and the charge storage layer 4 is formed on the surface of the insulator 5*a*. The charge storage layer 4 can store a signal charge of the three-dimensional semiconductor memory. The tunnel insulator 3 is formed on a surface of the charge storage layer 4, and the channel semiconductor layer 2 is formed on a surface of the tunnel insulator 3. The channel semiconductor layer 2 functions as a channel of the memory cell. The core insulator 1 is formed in the channel semiconductor layer 2.

The insulator 5*a* is, for example, a $SiO_2$ film (silicon oxide film). The charge storage layer 4 is, for example, an insulator such as a SiN film (silicon nitride film). The charge storage layer 4 may be a semiconductor layer such as a polysilicon layer. The tunnel insulator 3 is, for example, a SiON film (silicon oxynitride film). The tunnel insulator 3 may be a $SiO_2$ film. The channel semiconductor layer 2 is, for example, a polysilicon layer. The core insulator 1 is, for example, a $SiO_2$ film.

The insulators 5*b*, the barrier metal layers 6*a*, and the electrode material layers 6*b* are each formed between two insulating layers adjacent to each other in the Z direction, and are sequentially formed on the lower face of the upper insulating layer, the upper face of the lower insulating layer, and a side face of the insulator 5*a*. The insulator 5*b* is, for example, a metal insulator such as an $Al_2O_3$ film (aluminum oxide film). The barrier metal layer 6*a* is, for example, a TiN film (titanium nitride film). The electrode material layer 6*b* is, for example, a W (tungsten) layer.

Figure 2:
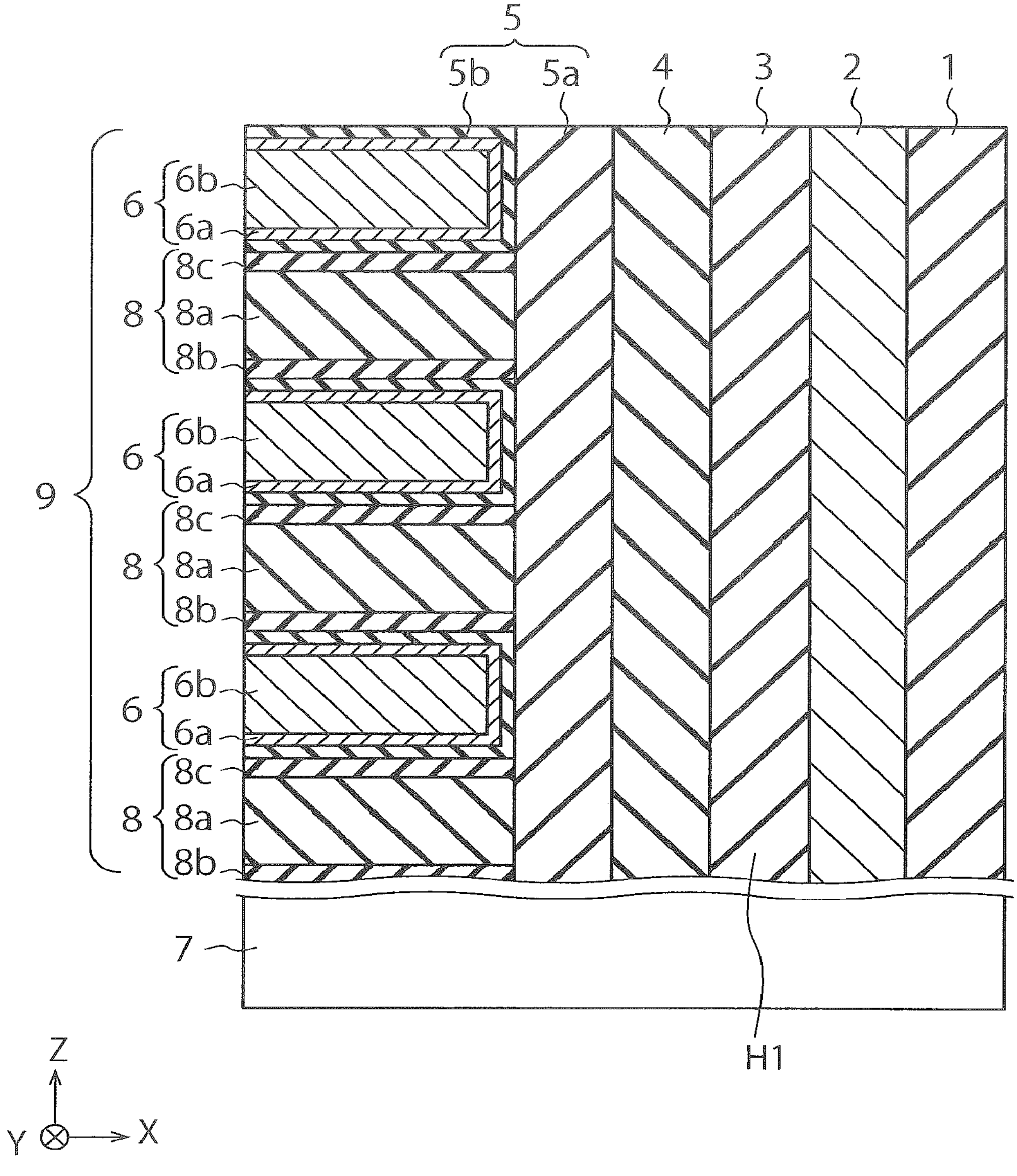
FIG. 2 is a cross-sectional view showing the structure of the semiconductor device of the first embodiment.

FIG. 2 is a cross-sectional view showing the structure of the semiconductor device of the first embodiment.

FIG. 2 shows a vertical cross section of the memory hole H1 shown in FIG. 1. As described with reference to FIG. 1, the semiconductor device of the present embodiment includes a plurality of insulating layers 8 and a plurality of electrode layers 6 alternately stacked on a substrate 7 (FIG. 2). The insulating layers 8 and the electrode layers 6 configure a stacked film 9. In the stacked film 9, these electrode layers 6 are separated from each other in the Z direction. Each electrode layer 6 includes the barrier metal layer 6*a* and the electrode material layer 6*b* described above. Each electrode layer 6 is an example of the second layer. The substrate 7 is, for example, a semiconductor substrate such as a Si (silicon) substrate. Each insulating layer 8 is, for example, a $SiO_2$ film. Each insulating layer 8 is an example of the first layer and a first insulating layer. Further details of each insulating layer 8 will be described later.

The insulator 5*a*, the charge storage layer 4, the tunnel insulator 3, the channel semiconductor layer 2, and the core insulator 1 are sequentially formed on a side face of the stacked film 9 in the memory hole H1, that is, side faces of the plurality of insulating layers 8 and the plurality of electrode layers 6 in the memory hole H1. The barrier metal layer 6*a* and the electrode material layer 6*b* in each electrode layer 6 are sequentially formed on the lower face of the upper insulating layer 8, the upper face of the lower insulating layer 8, and the side face of the insulator 5*a* via the insulator 5*b*.

Next, with continued reference to FIG. 2, each insulating layer 8 of the present embodiment will be described.

Each insulating layer 8 of the present embodiment includes silicon (Si), oxygen (O), and carbon (C), and is, for example, a $SiO_2$ film including carbon as an impurity. However, the concentrations of C atoms in each insulating layer 8 (hereinafter referred to as "C concentration") differ in each region in each insulating layer 8.

Specifically, as shown in FIG. 2, each insulating layer 8 of the present embodiment includes a bulk region 8*a*, a lower region 8*b*, and an upper region 8*c*. The bulk regions 8*a*, the lower regions 8*b*, and the upper regions 8*c* are all $SiO_2$ films including carbon as an impurity. The bulk region 8*a* is an example of the first region. The lower region 8*b* and the upper region 8*c* are examples of the second region.

The bulk region 8*a* is located substantially in the center of each insulating layer 8. The thickness of the bulk region 8*a* in the Z direction is, for example, 15 to 20 nm. The C concentration in the bulk regions 8*a* is, for example, 1.4 to 2.6 atomic %. This C concentration is an example of the first concentration. The C concentration in the bulk regions 8*a* of the present embodiment is given by dividing the number of C atoms in the bulk regions 8*a* by the number of Si, O, and C atoms in the bulk regions 8*a*. This also applies to other C concentrations described later.

The lower region 8*b* is located on the lower side of the bulk region 8*a* in each insulating layer 8. The thickness of the lower region 8*b* in the Z direction is thinner than the thickness of the bulk region 8*a* in the Z direction, and is, for example, 1 nm or less. The C concentration in the lower region 8*b* is higher than the C concentration in the bulk region 8*a*, and is, for example, 2.8 atomic % or more. This C concentration is an example of the second concentration. The lower region 8*b* is in contact with, for example, the upper face of the lower insulator 5*b*.

The upper region 8*c* is located on the upper side of the bulk region 8*a* in each insulating layer 8. The thickness of the upper region 8*c* in the Z direction is thinner than the thickness of the bulk region 8*a* in the Z direction, and is, for example, 1 nm or less. The C concentration in the upper region 8*c* is higher than the C concentration in the bulk region 8*a*, and is, for example, 2.8 atomic % or more. This C concentration is also an example of the second concentration. The upper region 8*c* is in contact with, for example, the lower face of the upper insulator 5*b*.

In the present embodiment, all the insulating layers 8 in the stacked film 9 include the bulk regions 8*a*, the lower regions 8*b*, and the upper regions 8*c*. However, only a part of the insulating layers 8 in the stacked film 9 may include the bulk regions 8*a*, the lower regions 8*b*, and the upper regions 8*c*. Further details of the insulating layers 8 will be described later.

FIGS. 3 to 7 are cross-sectional views showing a method of manufacturing the semiconductor device of the first embodiment.

Figure 3:
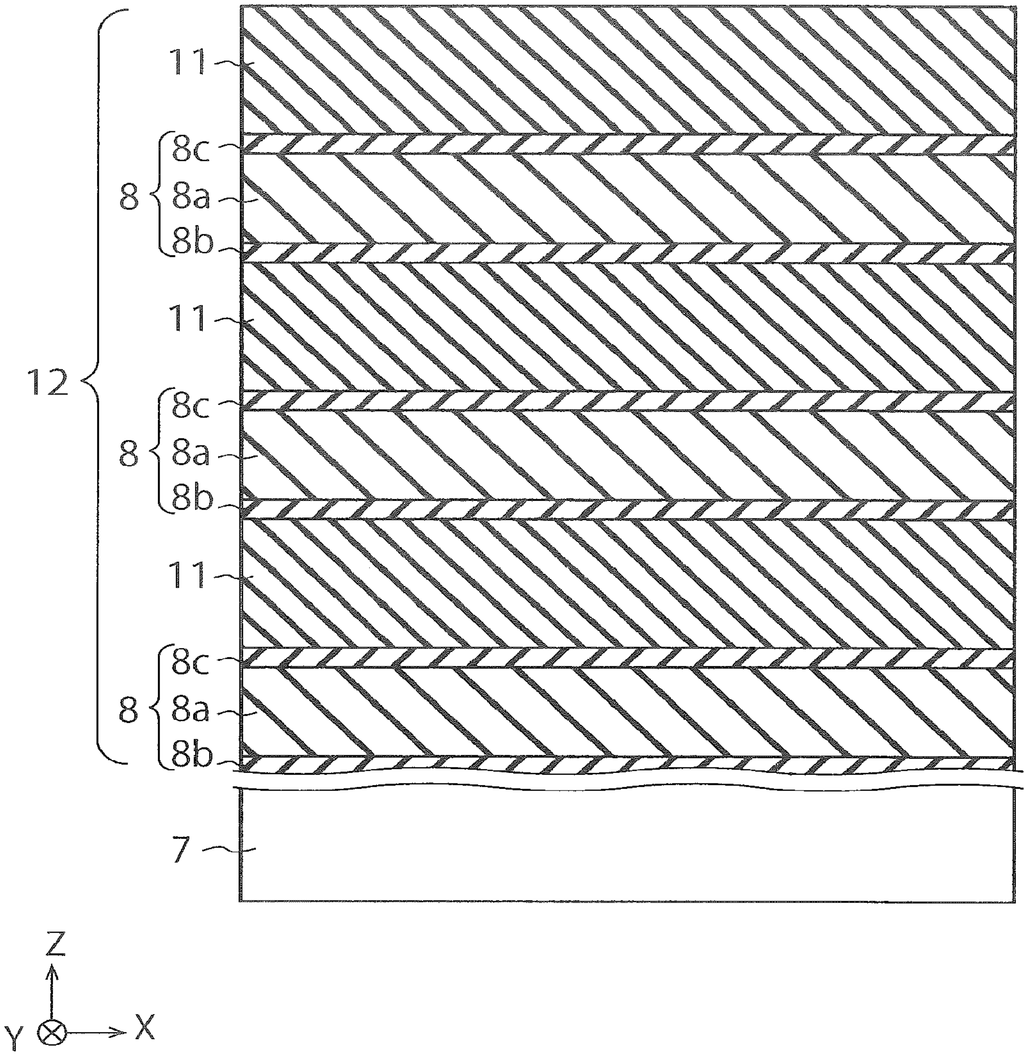
FIGS. 3 to 7 are cross-sectional views showing a method of manufacturing the semiconductor device of the first embodiment.

First, a substrate 7 is prepared, and a plurality of insulating layers 8 and a plurality of sacrificial layers 11 are alternately formed on the substrate 7 (FIG. 3). As a result, the stacked film 12 including the insulating layers 8 and the sacrificial layers 11 is formed on the substrate 7. Each sacrificial layer 11 is, for example, a SiN film. Each sacrificial layer 11 is an example of the second layer or a second insulating layer.

Each insulating layer 8 of the present embodiment is formed so as to include a bulk region 8*a*, a lower region 8*b*, and an upper region 8*c*. The thickness of the bulk region 8*a* is, for example, 15 to 20 nm. The C concentration in the bulk regions 8*a* is, for example, 1.4 to 2.6 atomic %. The thickness of the lower region 8*b* and the thickness of the upper region 8*c* are, for example, 1 nm or less. The C concentration in the lower region 8*b* and the C concentration in the upper region 8*c* are, for example, 2.8 atomic % or more. Each insulating layer 8 is formed, by forming a lower region 8*b*, forming a bulk region 8*a* in the lower region 8*b*, and forming an upper region 8*c* in the bulk region 8*a*.

Each insulating layer 8 of the present embodiment is a $SiO_2$ film including carbon as an impurity, and is formed by using a source gas including silicon (Si source gas) and a source gas including carbon (C source gas). The Si source gas is, for example, a silane gas such as $SiH_4$ gas, a TEOS (tetraethyl orthosilicate) gas, or a mixed gas including one or more of these (H represents hydrogen). The C source gas is, for example, CO gas, $CO_2$ gas, $C_XH_Y$ gas, $SiH_3(CH_3)$ gas (monomethylsilane gas), $SiH_2$ $(CH_3)_2$ gas (dimethylsilane gas), $SiH(CH_3)_3$ gas (trimethylsilane gas), $Si(CH_3)_4$ gas (tetramethylsilane gas), or a mixed gas including one or more of these (X represents an integer of 1 to 4 and Y represents an integer of 1 to 4). The Si source gas is an example of a second gas, and the C source gas is an example of a first gas.

Each insulating layer 8 of the present embodiment is formed by setting the conditions for forming the bulk region 8*a* and the conditions for forming the lower region 8*b* and the upper region 8*c* to different conditions. For example, when a Si source gas is supplied into a chamber accommodating the substrate 7, the flow rate of the Si source gas in forming the lower region 8*b* and the upper region 8*c* may be set smaller than the flow rate of the Si source gas in forming the bulk region 8*a*. Further, when a C source gas is supplied into the chamber accommodating the substrate 7, the flow rate of the C source gas in forming the lower region 8*b* and the upper region 8*c* may be set smaller than the flow rate of the C source gas in forming the bulk region 8*a*. According to the present embodiment, using one or both of these flow rate conditions can set the C concentrations in the lower region 8*b* and the upper region 8*c* higher than the C concentration in the bulk region 8*a*. Further details of these conditions will be described later.

Figure 4:
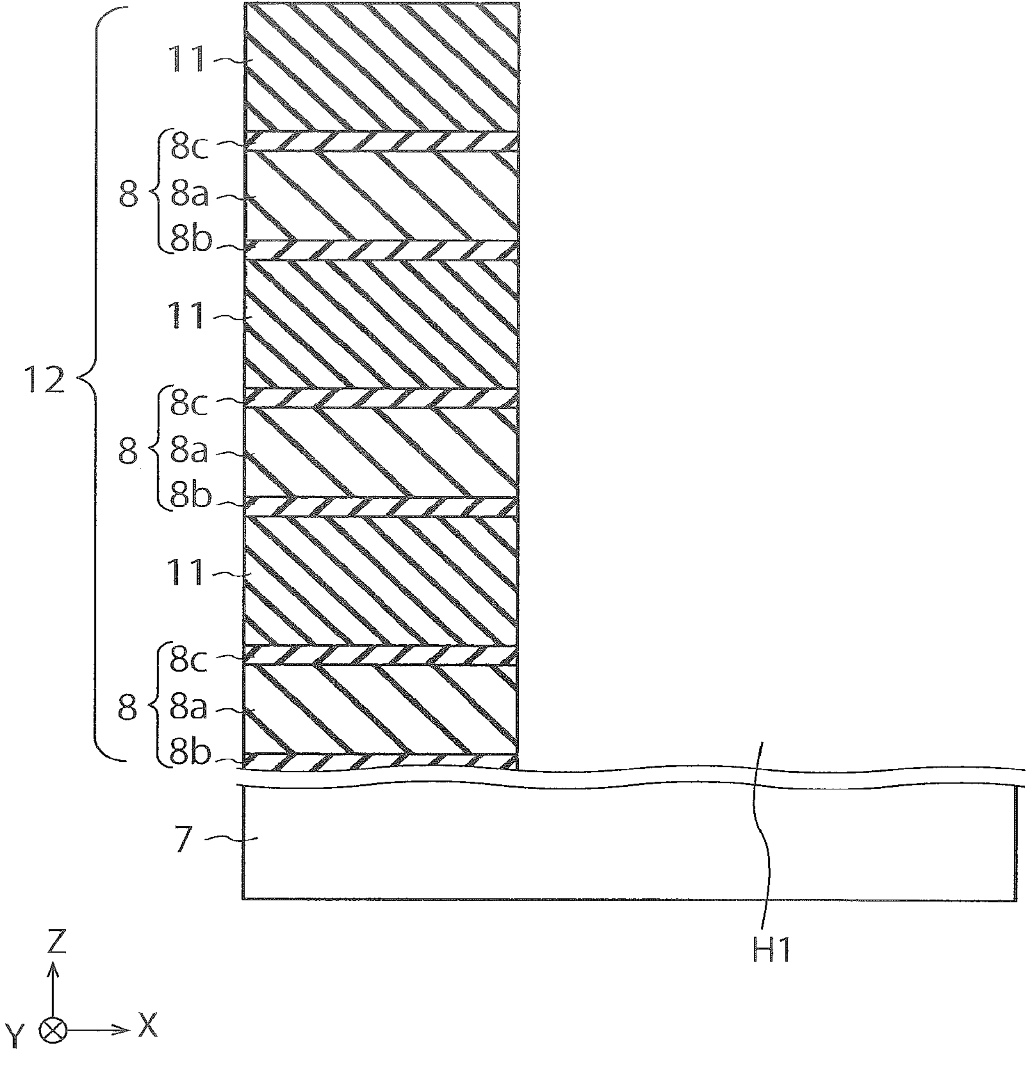

Next, photolithography and dry etching form a plurality of memory holes H1 in the stacked film 12 (FIG. 4). FIG. 4 illustrates one of these memory holes H1. Each memory hole H1 extends in the Z direction and is formed so as to penetrate the stacked film 12. The shape of each memory hole H1 in the present embodiment is cylindrical.

Figure 5:
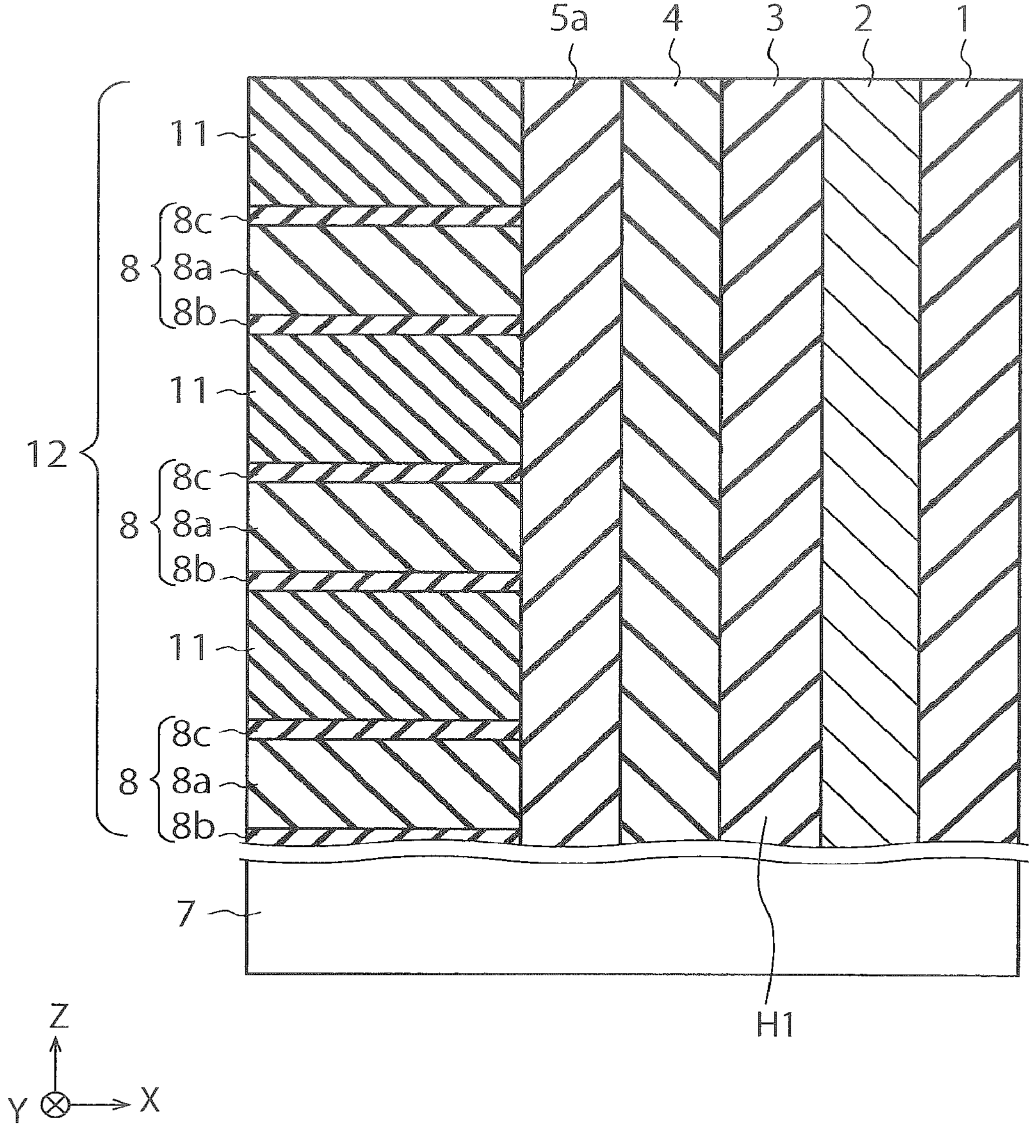

Next, the insulator 5*a*, the charge storage layer 4, the tunnel insulator 3, the channel semiconductor layer 2, and the core insulator 1 are sequentially formed in each memory hole H1 (FIG. 5). As a result, the insulator 5*a*, the charge storage layer 4, the tunnel insulator 3, the channel semiconductor layer 2, and the core insulator 1 are sequentially formed on a side face of the stacked film 12, that is, side faces of the plurality of insulating layers 8 and the plurality of sacrificial layers 11.

Figure 6:
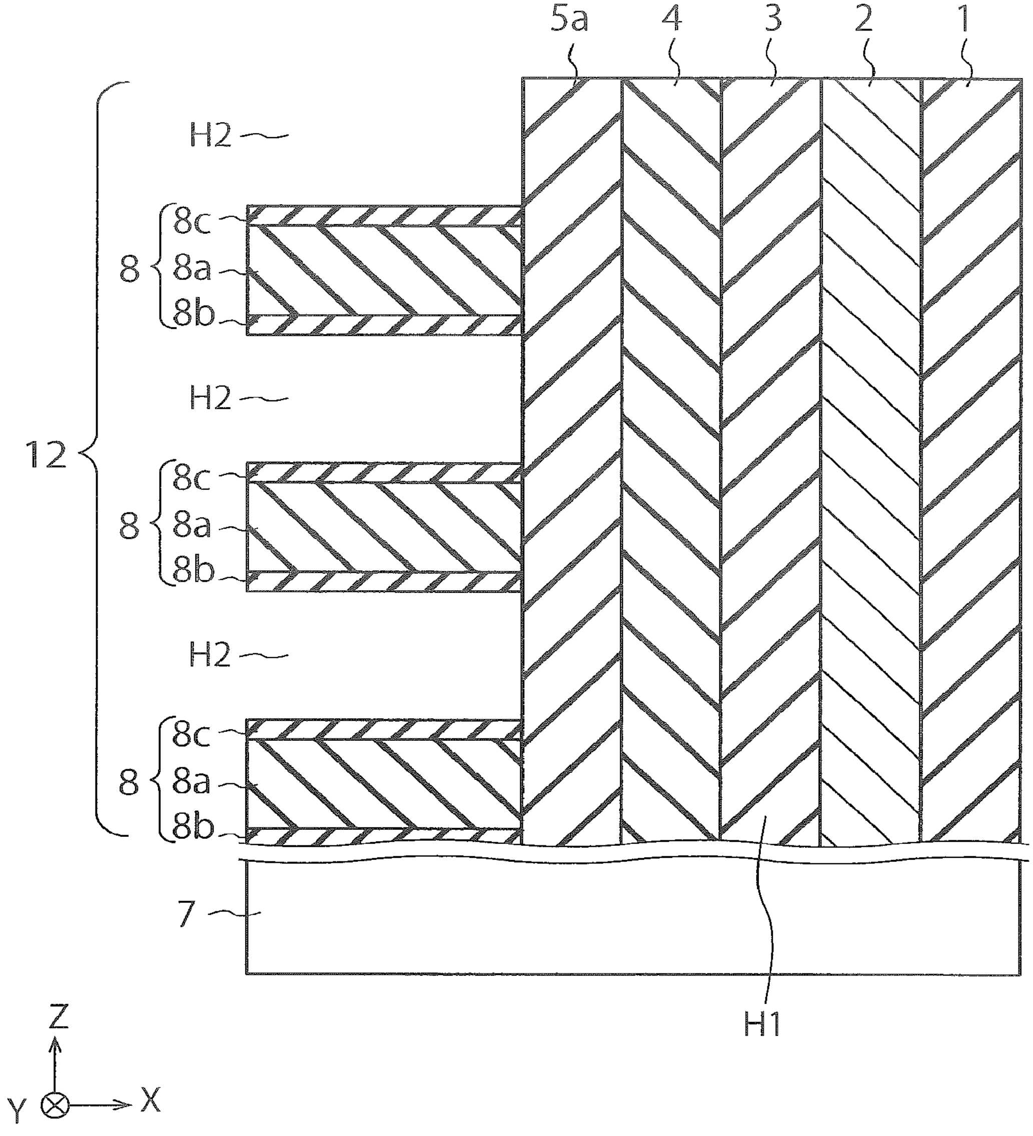

Next, a slit (not shown) is formed in the stacked film 12, and wet etching from the slit removes each sacrificial layer 11 (FIG. 6). As a result, a plurality of cavities H2 are formed in the stacked film 12. These cavities H2 are examples of concave portions. The above wet etching is performed using, for example, hydrofluoric acid or phosphoric acid.

Figure 7:
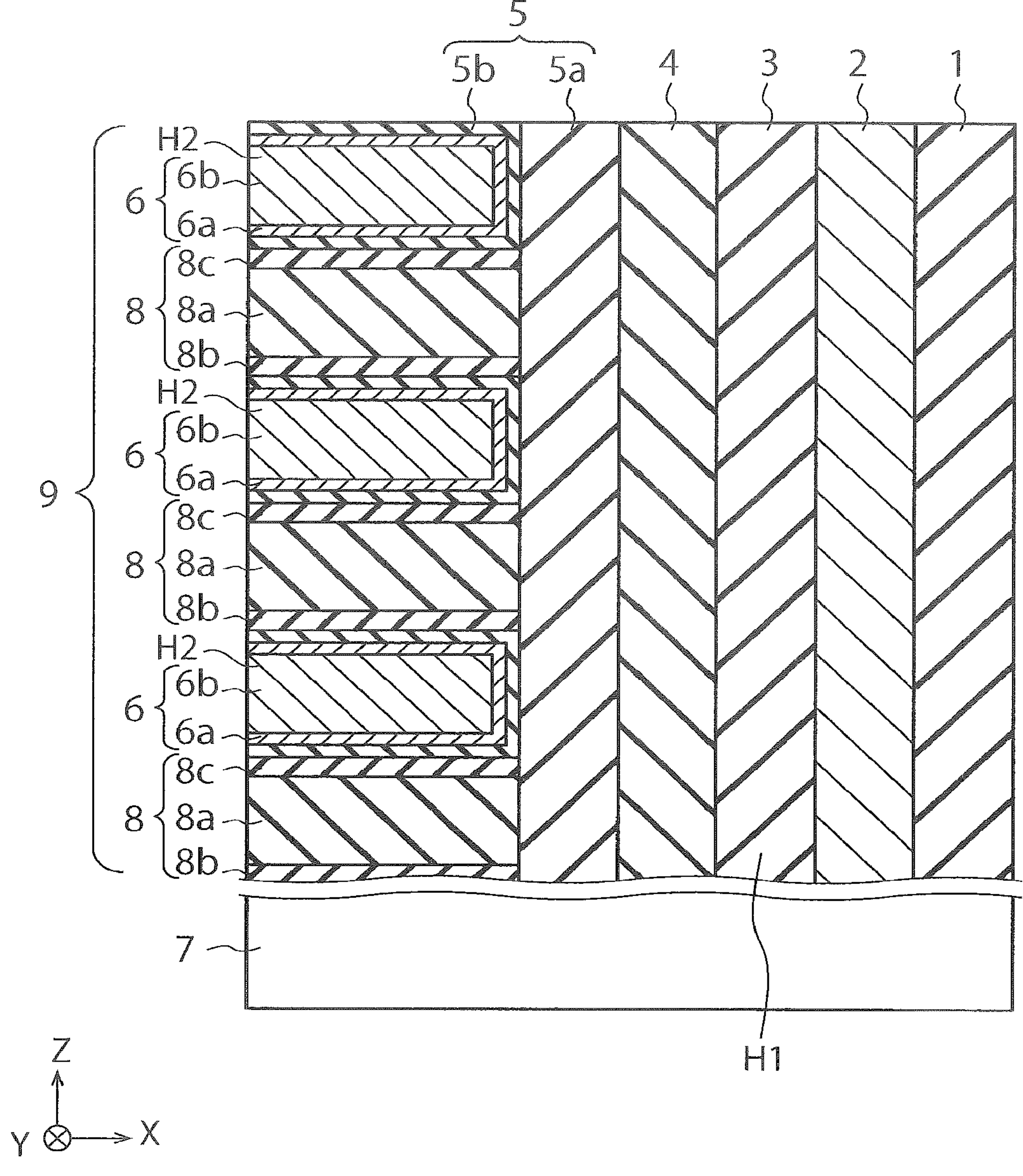

Next, the insulator 5*b*, the barrier metal layer 6*a*, and the electrode material layer 6*b* are sequentially formed in each cavity H2 (FIG. 7). This forms the block insulators 5 including the insulators 5*a* and the insulators 5*b*, and the electrode layers 6 including the barrier metal layers 6*a* and the electrode material layers 6*b*. Further, this forms a stacked film 9 including a plurality of insulating layers 8 and a plurality of electrode layers 6 alternately on the substrate 7. In other words, the sacrificial layers 11 are replaced with the electrode layers 6, and the stacked film 12 is replaced with the stacked film 9.

After that, the substrate 7 and various layers on the substrate 7 are annealed, and further, various plug layers, interconnect layers, inter layer dielectrics, and the like are formed on the substrate 7. In this way, the semiconductor device of the present embodiment is manufactured.

Although the bulk region 8*a* and the lower region 8*b* in each insulating layer 8 are the same insulators (for example, $SiO_2$ films) in the present embodiment, they may be different insulators from each other. For example, the bulk region 8*a* may be a $SiO_2$ film including carbon as an impurity, and the lower region 8*b* may be a SiON film including carbon as an impurity. Also in this case, the C concentration in the lower region 8*b* is desirably set higher than the C concentration in the bulk region 8*a*. This also applies to the bulk region 8*a* and the upper region 8*c* in each insulating layer 8.

Figure 8:
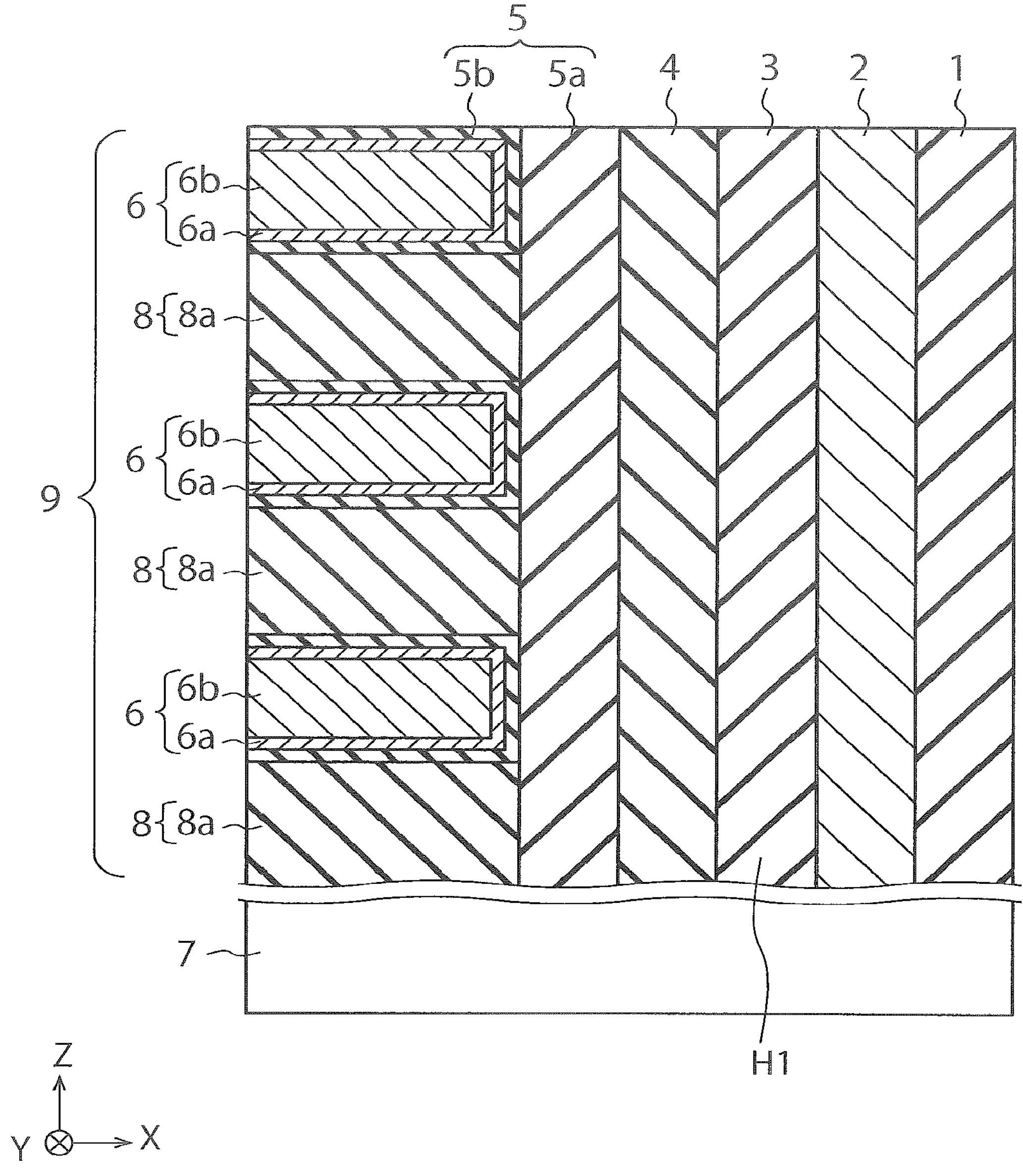
FIG. 8 is a cross-sectional view showing a structure of a semiconductor device of a first comparative example of the first embodiment.
Figure 9:
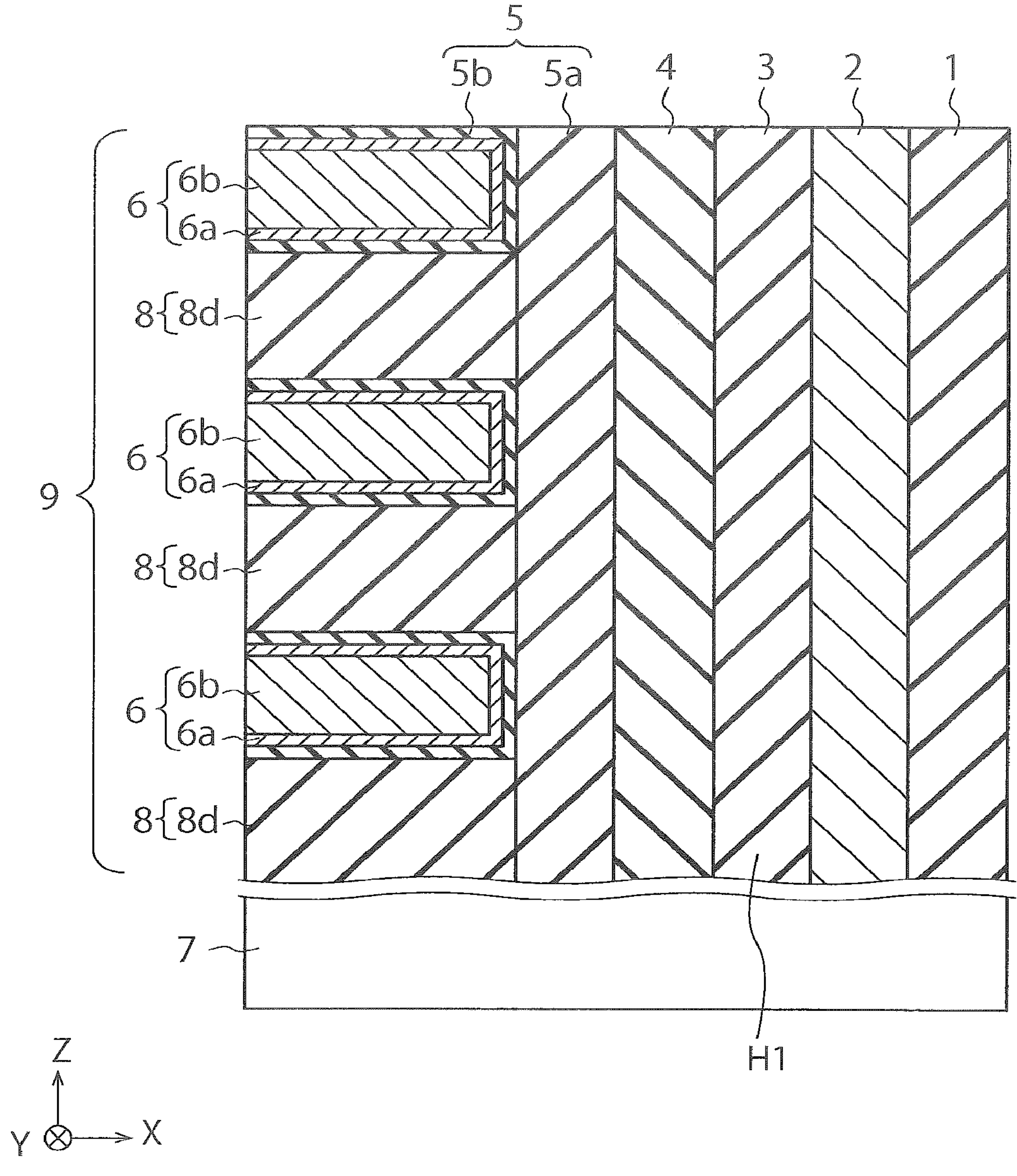
FIG. 9 is a cross-sectional view showing a structure of a semiconductor device of a second comparative example of the first embodiment.

Next, with reference to FIGS. 8 and 9, the semiconductor device of the present embodiment is compared with the semiconductor device of comparative examples.

FIG. 8 is a cross-sectional view showing the structure of a semiconductor device of a first comparative example of the first embodiment.

The semiconductor device of this comparative example includes similar components to the semiconductor device of the first embodiment (FIG. 2). However, each insulating layer 8 of this comparative example includes only the bulk region 8*a* including a low-concentration of C atoms, and does not include the lower region 8*b* and the upper region 8*c* each including a high-concentration of C atoms.

In this case, when the semiconductor device of this comparative example is manufactured by the method shown in FIGS. 3 to 7, the shape of the insulating layer 8 may deform at the stage shown in FIG. 6, or the etching resistance of the insulating layer 8 may deteriorate at the stage shown in FIG. 6. FIG. 6 shows a step of removing the sacrificial layer 11 by wet etching as described above.

In FIG. 6, because the insulating layers 8 are exposed to the cavities H2, shapes of the insulating layers 8 may bend. The bend of the insulating layers 8 may be more remarkable as the stacked film 12 is finer and more highly stacked. The reason is that as the stacked film 12 is finer and more highly stacked, thicknesses of the insulating layers 8 are thinner, or stresses applied to the insulating layers 8 are larger. Further, tapering of the shapes of the insulating layers 8 during wet etching also causes the insulating layers 8 to bend.

The verification has found that these problems are less likely to occur as the C concentrations in the bulk regions 8*a* increase. For example, the higher the C concentrations in the bulk regions 8*a*, the smaller the stresses applied to the insulating layers 8. Further, the higher the C concentration in the bulk regions 8*a*, the higher the resistance of the insulating layers 8 to wet etching.

FIG. 9 is a cross-sectional view showing the structure of a semiconductor device of a second comparative example of the first embodiment.

The semiconductor device of this comparative example also includes similar components to the semiconductor device of the first embodiment (FIG. 2). However, each insulating layer 8 of this comparative example includes only a bulk region 8*d* including a high-concentration of C atoms, instead of including only the bulk region 8*a* including a low-concentration of C atoms. The C concentration in the bulk region 8*d* is, for example, 2.8 atomic % or more.

In this case, when the semiconductor device of this comparative example is manufactured by the method shown in FIGS. 3 to 7, the shape of the insulating layer 8 can be prevented from deforming at the stage shown in FIG. 6, or the etching resistance of the insulating layer 8 can be prevented from deteriorating at the stage shown in FIG. 6. However, because the insulating layer 8 includes high-concentration of C atoms, a large leakage current due to the insulating layer 8 may occur during the operation of the semiconductor device. In other words, if the C concentration in the bulk region 8*d* is high, the leakage current in the semiconductor device may increase.

Therefore, each insulating layer 8 of the present embodiment includes a bulk region 8*a* including a low-concentration of C atoms, and a lower region 8*b* and an upper region 8*c* each including a high-concentration of C atoms (FIG. 2). As a result, the surface of each insulating layer 8 is reinforced and protected by the lower region 8*b* and the upper region 8*c*, so that the shape of the insulating layer 8 can be prevented from deforming, and the etching resistance of the insulating layer 8 can be prevented from deteriorating. Further, each insulating layer 8 includes the bulk region 8*a*, so that the average C concentration can be reduced in the insulating layer 8 and the leakage current can be reduced in the semiconductor device. As described above, the present embodiment makes it possible to form the stacked film 12 (9) having suitable properties.

The C concentrations in the bulk region 8*a*, the lower region 8*b*, and the upper region 8*c* are desirably set to values such that the shape of the insulating layer 8 can be suitably prevented from deforming, the etching resistance of the insulating layer 8 can be suitably prevented from deteriorating, and the leakage current can be suitably prevented from increasing. The present embodiment makes it possible to set the C concentrations in the lower region 8*b* and the upper region 8*c* to 2.8 atomic % or more, to sufficiently prevent the shape of the insulating layer 8 from deforming and the etching resistance of the insulating layer 8 from deteriorating. Further, the present embodiment makes it possible to set the C concentration in the bulk region 8*a* to 1.4 to 2.6 atomic %, to sufficiently reduce the leakage current.

Further, a result of the verification shows the problems of deformation and etching resistance can be eliminated or reduced with the lower regions 8*b* and the upper regions 8*c* each having a thickness of 1 nm or less. Therefore, the thickness of the lower region 8*b* and the upper region 8*c* of the present embodiment is desirably set to 1 nm or less. This makes it possible to prevent the problems with deformation and etching resistance while effectively preventing the leakage current from increasing.

Figures 10A, 10B:
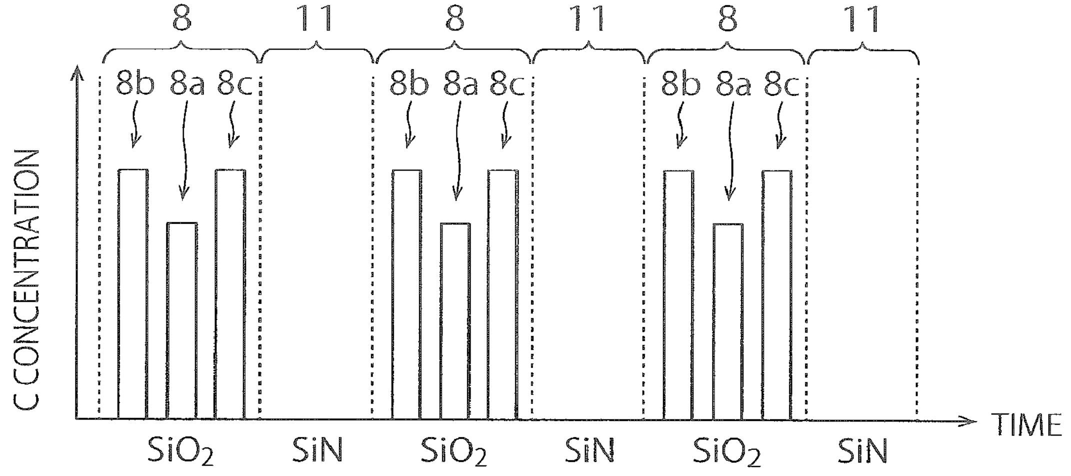
FIGS. 10A and 10B are a graph and a table for illustrating a method of manufacturing the semiconductor device of the first embodiment.

FIGS. 10A and 10B are a graph and a table for illustrating a method of manufacturing the semiconductor device of the first embodiment.

FIG. 10A is a graph for illustrating the step shown in FIG. 3, that is, the step of forming the stacked film 12. The horizontal axis of FIG. 10A shows the time in the step of forming the stacked film 12. The vertical axis of FIG. 10A shows C concentration of portions of the stacked film 12. For example, when the bulk region 8*a* in each insulating layer 8 is formed, the C concentration in the bulk region 8*a* is set low, and when the lower region 8*b* and the upper region 8*c* in each insulating layer 8 are formed, the C concentrations in the lower region 8*b* and the upper region 8*c* are set high. The C concentration in each insulating layer 8 can be set high, for example, by reducing the flow rate of the Si source gas or reducing the flow rate of the C source gas.

FIG. 10B shows various parameters capable of increasing the C concentration in the insulating layer 8. For example, reducing the flow rate of the silane gas, which is the Si source gas, can increase the C concentration in the insulating layer 8. Further, reducing the flow rate of the $CO_2$ gas, which is the C source gas, can increase the C concentration in the insulating layer 8.

When the insulating layers 8 are formed, the Si source gas, the C source gas, and the inert gas may be supplied into the chamber accommodating the substrate 7. The inert gas is, for example, a rare gas such as Ar (argon) gas or $N_2$ (nitrogen) gas. According to FIG. 10B, increasing the flow rates of Ar gas or reducing the flow rate of $N_2$ gas can increase the C concentrations in the insulating layers 8. For example, the flow rates of Ar gas in forming the lower regions 8*b* and the upper regions 8*c* may be set larger than the flow rates of Ar gas in forming the bulk regions 8*a*, to make the C concentrations in the lower regions 8*b* and the upper regions 8*c* higher than the C concentrations in the bulk regions 8*a*.

According to FIG. 10B, reducing the pressure in the chamber accommodating the substrate 7 can increase the C concentrations in the insulating layers 8. For example, the pressures in the chamber in forming the lower regions 8*b* and the upper regions 8*c* are set lower than the pressures in the chamber in forming the bulk regions 8*a*, to make the C concentrations in the lower regions 8*b* and the upper regions 8*c* higher than the C concentrations in the bulk regions 8*a*.

HF and LF shown in FIG. 10B respectively indicate high-frequency and low-frequency RF (Radio Frequency) powers in forming the insulating layers 8. According to FIG. 10B, reducing the high-frequency RF power or increasing the low-frequency RF power can increase the C concentrations in the insulating layers 8. For example, the low-frequency RF powers in forming the lower regions 8*b* and the upper regions 8*c* may be set higher than the low-frequency RF powers in forming the bulk regions 8*a*, to make the C concentrations in the lower regions 8*b* and the upper regions 8*c* higher than the C concentrations in the bulk regions 8*a*.

The present embodiment makes it possible to adjust these parameters, to easily change the C concentration in each insulating layer 8 for each region in each insulating layer 8.

As described above, each insulating layer 8 of the present embodiment includes a bulk region 8*a*, and a lower region 8*b* and an upper region 8*c* each having a C concentration higher than the C concentration in the bulk region 8*a*. Therefore, the present embodiment makes it possible to form a suitable stacked film 9 (12) capable of preventing the shape of the insulating layer 8 from deforming, the etching resistance of the insulating layer 8 from deteriorating, and the leakage current from increasing.

Second and Third Embodiments

Figure 11:
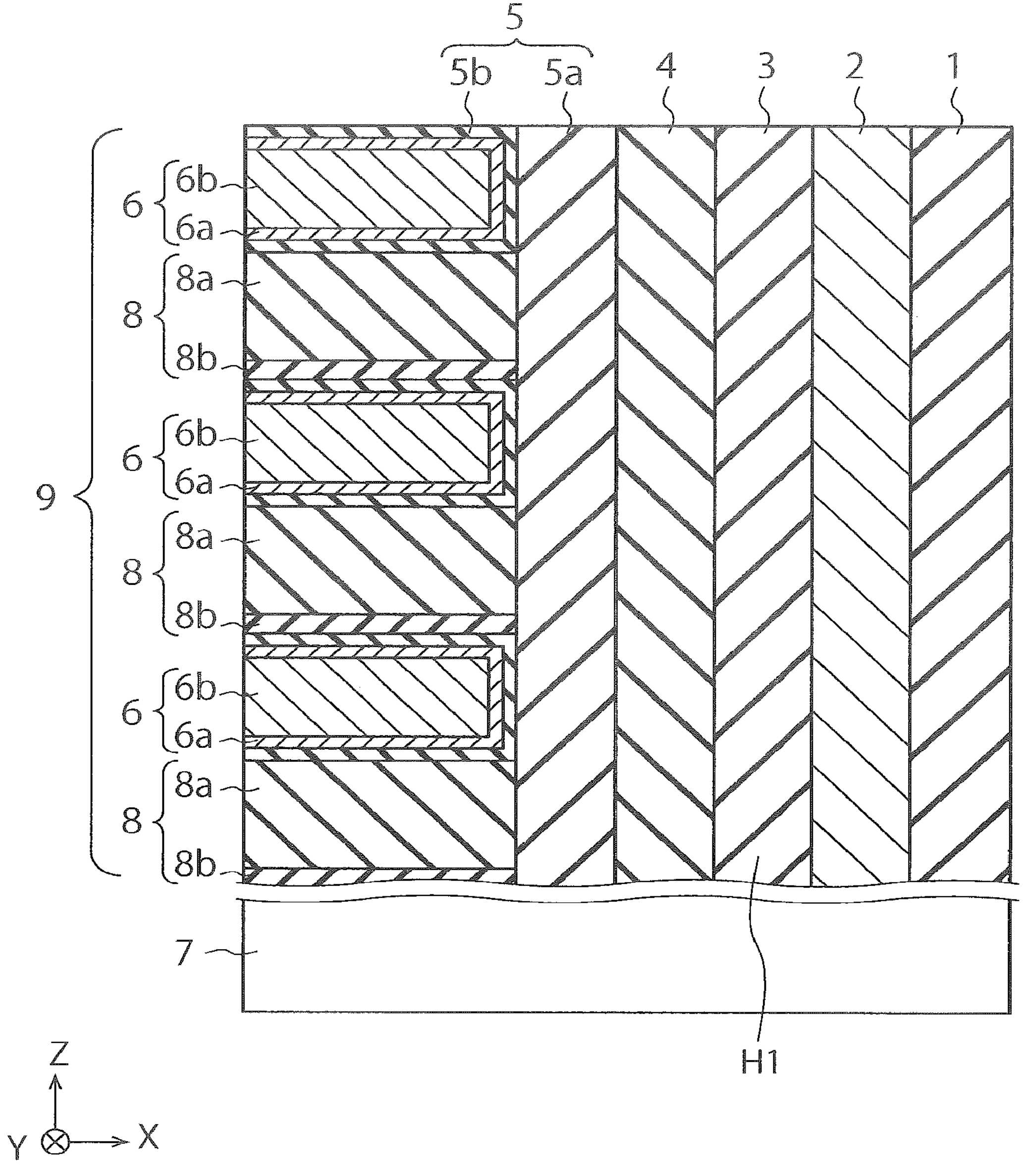
FIG. 11 is a cross-sectional view showing a structure of a semiconductor device of a second embodiment.

FIG. 11 is a cross-sectional view showing a structure of a semiconductor device of a second embodiment.

The semiconductor device of the present embodiment includes similar components to the semiconductor device of the first embodiment (FIG. 2). However, each insulating layer 8 of the present embodiment includes a bulk region 8*a* including a low-concentration of C atoms, and a lower region 8*b* including a high-concentration of C atoms, but it does not include the upper region 8*c* including a high-concentration of C atoms.

Figure 12:
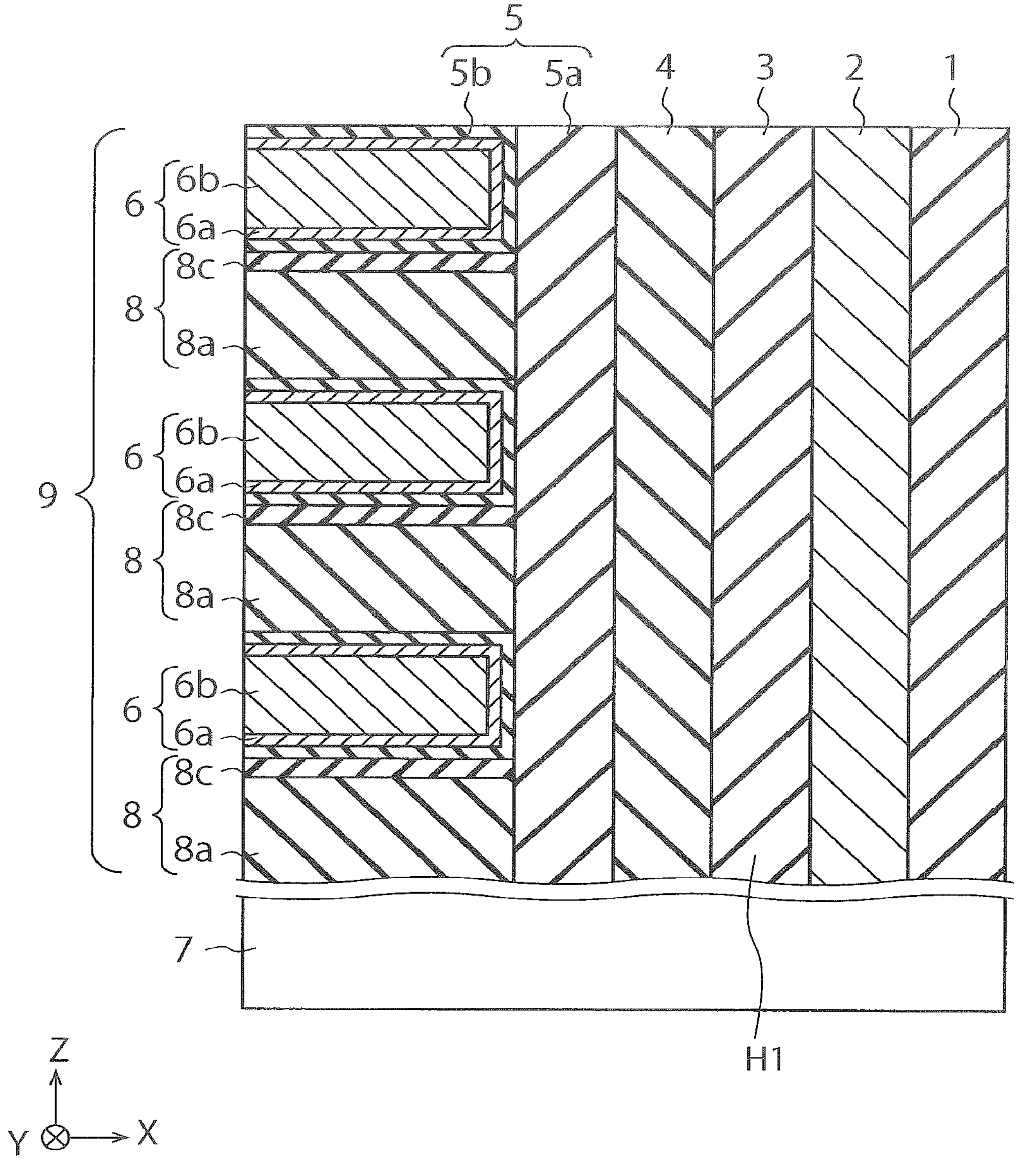
FIG. 12 is a cross-sectional view showing a structure of a semiconductor device of a third embodiment.

FIG. 12 is a cross-sectional view showing a structure of a semiconductor device of a third embodiment.

The semiconductor device of the present embodiment also includes similar components to the semiconductor device of the first embodiment (FIG. 2). However, each insulating layer 8 of the present embodiment includes a bulk region 8*a* including a low-concentration of C atoms, and an upper region 8*c* including a high-concentration of C atoms, but it does not include a lower region 8*b* including a high-concentration of C atoms.

These embodiments make it possible to prevent the shape of the insulating layer 8 from deforming, and the etching resistance of the insulating layer 8 from deteriorating compared to the first comparative example. Further, these embodiments make it possible to reduce the leakage current compared to the second comparative example.

Fourth Embodiment

Figure 13:
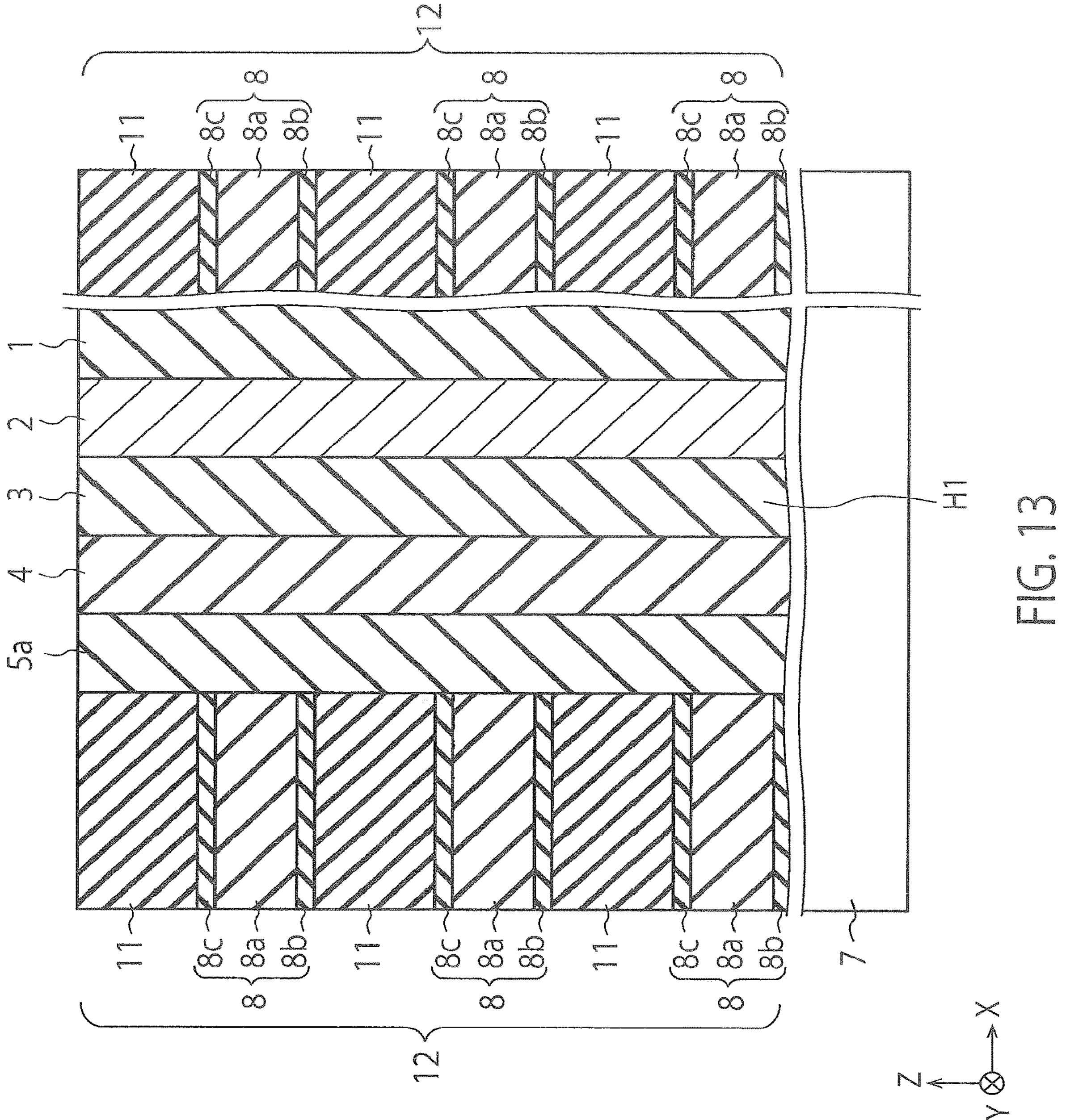
FIGS. 13 to 15 are cross-sectional views showing a method of manufacturing a semiconductor device of a fourth embodiment.
Figure 14:
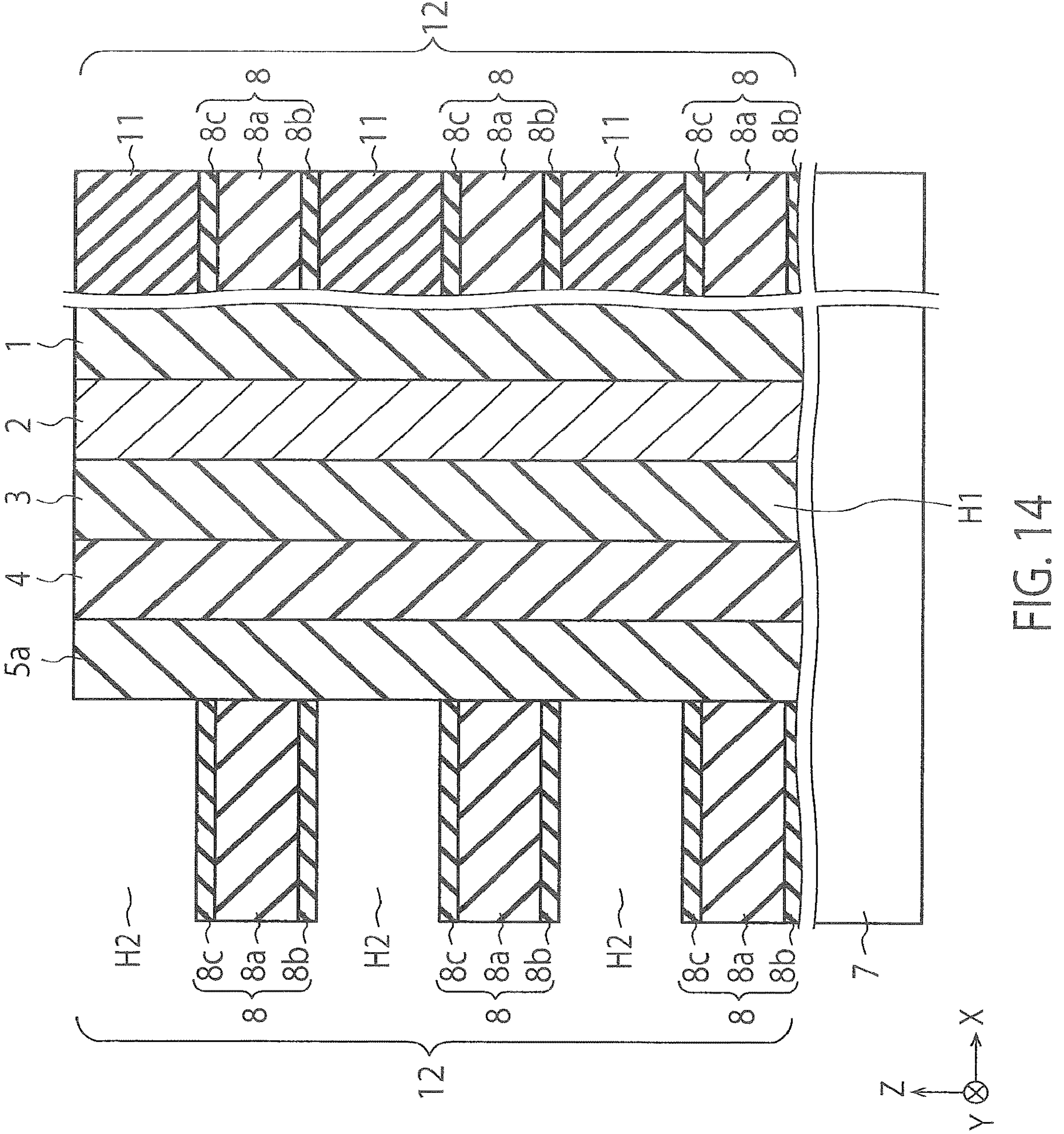
Figure 15:
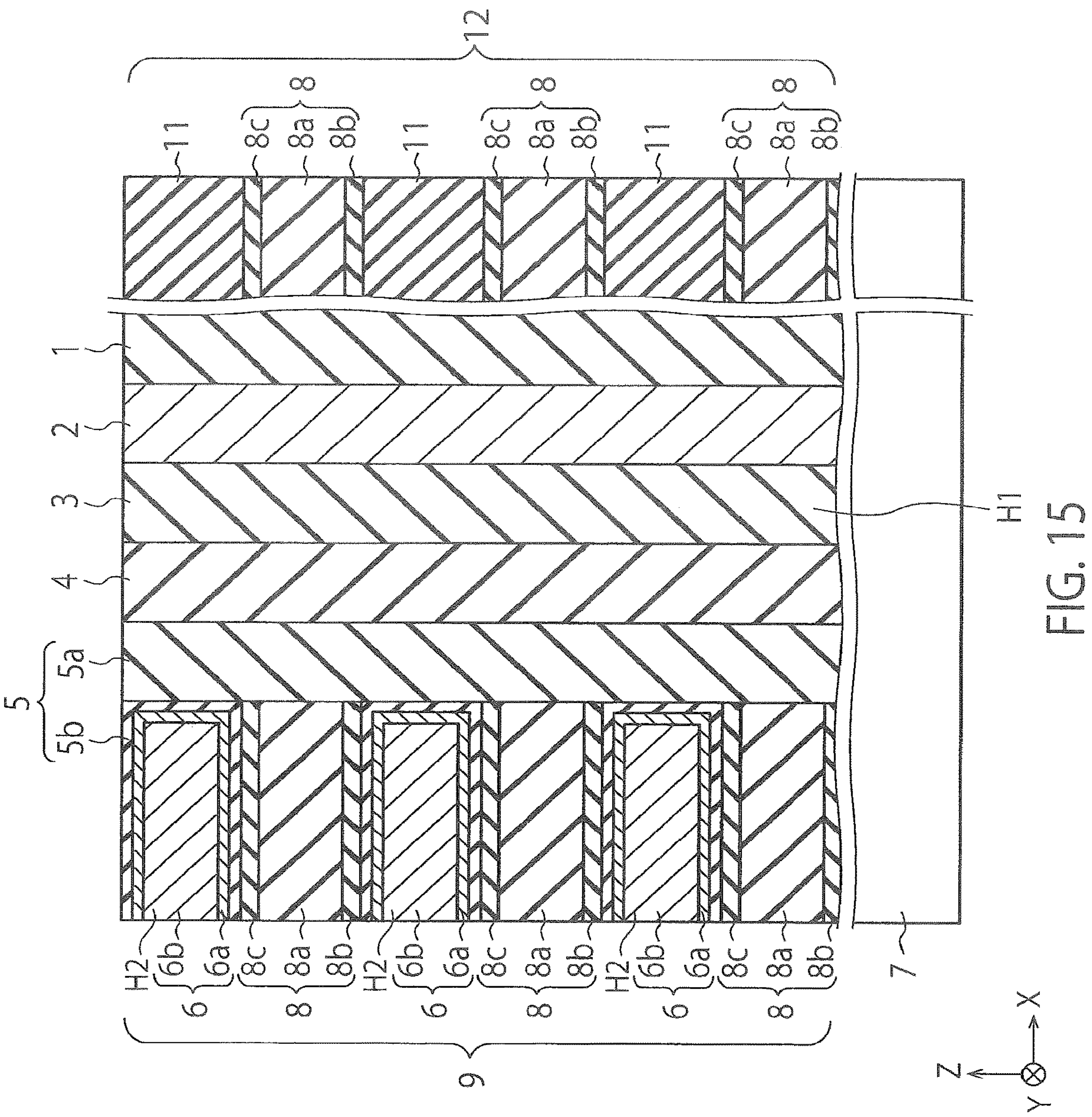

FIGS. 13 to 15 are cross-sectional views showing a method of manufacturing a semiconductor device of a fourth embodiment.

The steps shown in FIGS. 13 to 15 are modified embodiments of the steps shown in FIGS. 5 to 7. Similarly to FIG. 5, FIG. 13 shows a step of sequentially forming an insulator 5*a*, a charge storage layer 4, a tunnel insulator 3, a channel semiconductor layer 2, and a core insulator 1 in each memory hole H1. Similarly to FIG. 6, FIG. 14 shows a step of removing each sacrificial layer 11 to form a plurality of cavities H2 in the stacked film 12. Similarly to FIG. 7, FIG. 15 shows a step of sequentially forming an insulator 5*b*, a barrier metal layer 6*a*, and an electrode material layer 6*b* in each cavity H2. As a result, the sacrificial layers 11 are replaced with the electrode layer 6, and the stacked film 12 is replaced with the stacked film 9.

However, the step shown in FIG. 14 is performed in such a manner as to remove only some of sacrificial layers 11, without removing all of sacrificial layers 11. As a result, the structure shown in FIG. 15 includes not only the electrode layers 6 (stacked film 9) generated by being replaced with the sacrificial layers 11 (stacked film 12), but also the sacrificial layers 11 (stacked film 12) that remain without being replaced with the electrode layers 6 (stacked film 9). Therefore, the finished semiconductor device of the present embodiment includes the electrode layers 6, the insulating layers 8, and the sacrificial layers 11. Additionally, the stacked film that includes the electrode layers 6, the insulating layers 8, and the sacrificial layers 11, includes a memory hole H1 inside. The insulating layers 8 are examples of the first layers, and the electrode layers 6 and the sacrificial layers 11 are examples of the second layers. Further, the insulating layers 8 are examples of the first insulating layers, and the sacrificial layers 11 are examples of the second insulating layers.

The sacrificial layers 11 may remain in any part of the finished semiconductor device as long as they do not interfere with the operation of the finished semiconductor device. For example, when the finished semiconductor device includes a via plug that penetrates the stacked film including the electrode layers 6, the insulating layers 8, and the sacrificial layers 11, the sacrificial layers 11 may remain in the vicinity of the via plug.

FIGS. 16A to 16D are plan views showing details of the method of manufacturing the semiconductor device of the fourth embodiment.

As shown in FIG. 16A, the substrate (wafer) 7 of the present embodiment includes a plurality of regions R1. Each region R1 corresponds to one shot in manufacturing the semiconductor device of the present embodiment.

As shown in FIG. 16B, each region R1 includes a plurality of regions R2. Each region R2 corresponds to one semiconductor device (chip) of the present embodiment.

As shown in FIG. 16C, each region R2 includes a plurality of regions R3. Each region R3 corresponds to one plane in each chip of the present embodiment.

As shown in FIG. 16D, each region R3 includes a central portion P1 and end portions P2. The central portion P1 is located in a region sandwiched between the two slits. The end portions P2 are each located in a region not sandwiched between the two slits. Further details of the central portion P1 and the end portions P2 will be described later.

Figure 17:
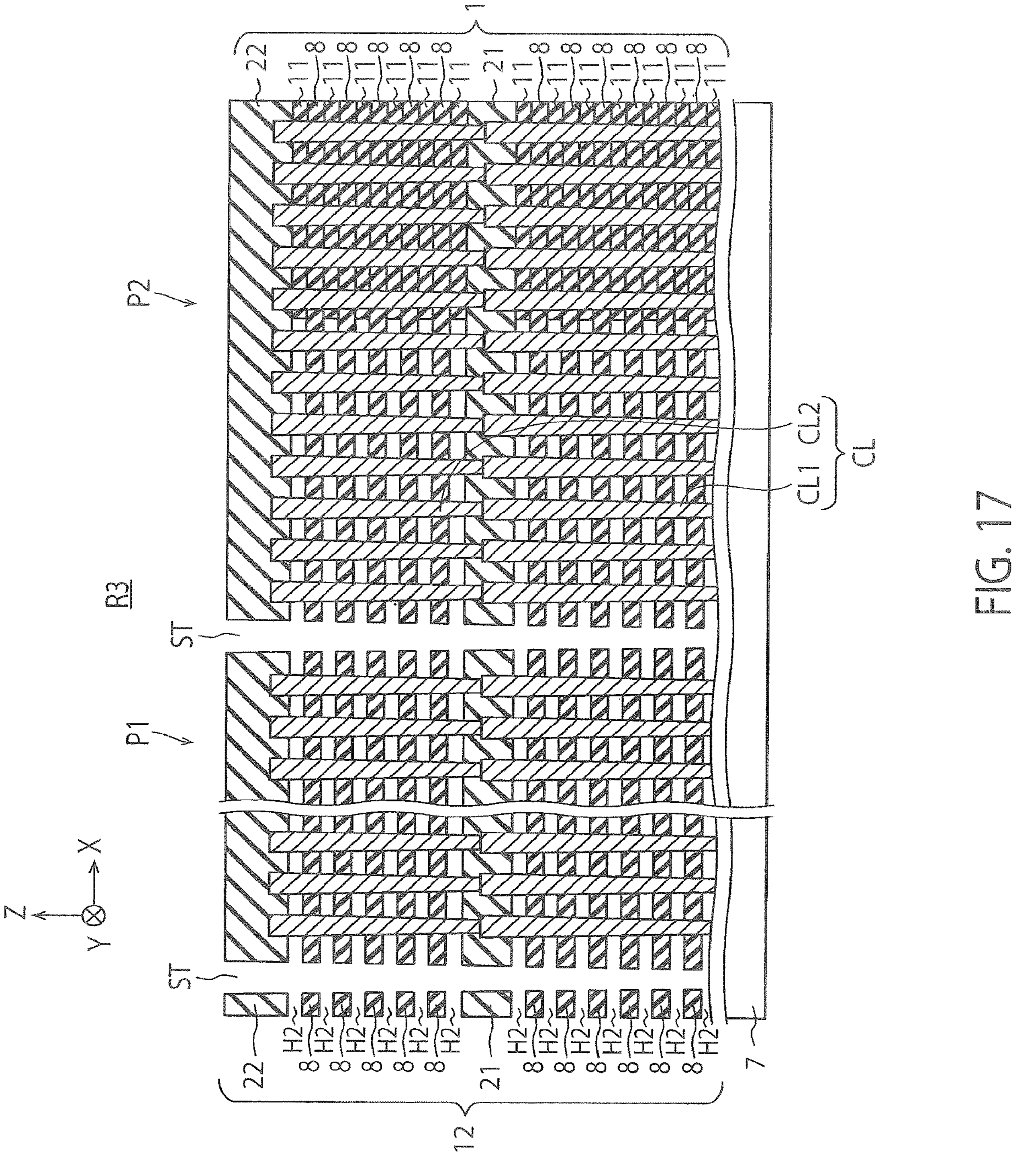
FIG. 17 is a cross-sectional view showing details of the method of manufacturing the semiconductor device of the fourth embodiment.

FIG. 17 is a cross-sectional view showing details of the method of manufacturing the semiconductor device of the fourth embodiment.

FIG. 17 shows a specific example of the step shown in FIG. 14. Therefore, FIG. 17 shows a step of removing sacrificial layers 11 to form a plurality of cavities H2 in the stacked film 12. In FIG. 17, not all of sacrificial layers 11 are removed, and only some of sacrificial layers 11 are removed.

FIG. 17 shows an example of the central portion P1 and end portions P2 shown in FIGS. 16A to 16D and a plurality of slits ST provided in the stacked film 12. Each slit ST extends in the Y direction and the Z direction and penetrates the stacked film 12. In addition to the plurality of insulating layers 8 and the plurality of sacrificial layers 11, the stacked film 12 shown in FIG. 17 includes an insulating layer 21 provided between two sacrificial layers 11 adjacent to each other, an insulating layer 22 provided on the uppermost sacrificial layer 11. The insulating layers 21 and 22 are, for example, a $SiO_2$ film. In FIG. 17, the central portion P1 is located in the region sandwiched between the two slits ST, and the end portions P2 are located in the regions not sandwiched between the two slits ST.

FIG. 17 further shows a plurality of columnar portions CL provided in the stacked film 12. Each columnar portion CL sequentially includes the above-mentioned insulator 5*a*, charge storage layer 4, tunnel insulator 3, channel semiconductor layer 2, and core insulator 1. Each columnar portion CL shown in FIG. 17 includes: the lower columnar portion CL1 provided in the insulating layer 21 and at a position lower than the insulating layer 21; and an upper columnar portion CL2 provided in the insulating layer 21 and at a position higher than the insulating layer 21.

In the step shown in FIG. 17, the slits ST are formed in the stacked film 12, and wet etching from the slits ST removes the sacrificial layers 11. At this time, sacrificial layers 11 in the central portion P1 are sandwiched between the two slits ST, so that all of them are typically removed by the wet etching. On the other hand, sacrificial layers 11 in the end portions P2 are not sandwiched between the two slits ST, so that only a part of them is typically removed by the wet etching. Therefore, FIG. 17 shows the sacrificial layers 11 remaining in the end portions P2.

After that, as described above, the step shown in FIG. 15 is performed. As a result, the finished semiconductor device manufactured in this case also includes the electrode layers 6, the insulating layers 8, and the sacrificial layers 11, and the stacked film that includes the electrode layers 6, the insulating layers 8, and the sacrificial layers 11, includes a memory hole H1 inside.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:

a substrate;

a stacked film including a plurality of first layers and a plurality of second layers alternately provided on the substrate;

a charge storage layer provided on a side face of the stacked film via a first insulator; and a semiconductor layer provided on a side face of the charge storage layer via a second insulator, wherein one of the plurality of first layers includes:

a first region that includes carbon having a first concentration; and a second region that includes carbon having a second concentration higher than the first concentration, and includes a lower region provided on a lower side of the first region, having an upper face in contact with a lower face of the first region, being in contact with the first insulator, and located in a first direction of the first region or an upper region provided on an upper side of the first region, having an lower face in contact with an upper face of the first region, being in contact with the first insulator, and located in a second direction of the first region, the first direction and the second direction being perpendicular to a surface of the substrate.

2. The device of claim 1, wherein the first concentration is 1.4 to 2.6 atomic %, and the second concentration is 2.8 atomic % or more.

3. The device of claim 1, wherein the second region includes both the lower region and the upper region.

4. The device of claim 1, wherein the second region includes only the lower region out of the lower region and the upper region.

5. The device of claim 1, wherein the second region includes only the upper region out of the lower region and the upper region.

6. The device of claim 1, wherein a thickness of the lower region or the upper region is thinner than a thickness of the first region.

7. The device of claim 1, wherein a thickness of the lower region or the upper region is 1 nm or less.

8. The device of claim 1, wherein each of the plurality of first layers includes a first insulating layer, and each of the plurality of second layers includes an electrode layer.

9. The device of claim 1, wherein each of the plurality of first layers includes a first insulating layer, and each of the plurality of second layers includes a second insulating layer different from the first insulating layer.

10. The device of claim 1, wherein each of the plurality of first layers includes silicon, oxygen and carbon.

11. The device of claim 10, wherein each of the plurality of first layers is a silicon oxide film including carbon as an impurity.

12. The device of claim 1, wherein the first region is in contact with the first insulator.

13. The device of claim 1, wherein the second region includes only one of the lower region and the upper region.

14. The device of claim 1, wherein each of the plurality of first layers includes a first insulating layer, and each of the plurality of second layers includes an electrode layer, and a second insulating layer different from the first insulating layer.

15. The device of claim 1, wherein the stacked film includes:

a third region including a plurality of first insulating layers and a plurality of electrode layers alternately provided on the substrate, and a fourth region including the plurality of first insulating layers and a plurality of second insulating layers alternately provided on the substrate.

16. A method of manufacturing a semiconductor device, comprising:

forming a stacked film including a plurality of first layers and a plurality of second layers alternately provided on a substrate;

forming a charge storage layer on a side face of the stacked film via a first insulator; and forming a semiconductor layer on a side face of the charge storage layer via a second insulator, wherein one of the plurality of first layers is formed to include:

a first region that includes carbon having a first concentration; and a second region that includes carbon having a second concentration higher than the first concentration, and includes a lower region provided on a lower side of the first region, having an upper face in contact with a lower face of the first region, being in contact with the first insulator, and located in a first direction of the first region or an upper region provided on an upper side of the first region, having a lower face in contact with an upper face of the first region, being in contact with the first insulator, and located in a second direction of the first region, the first direction and the second direction being perpendicular to a surface of the substrate.

17. The method of claim 16, wherein each of the plurality of first layers including a first insulating layer, each of the plurality of second layers including a second insulating layer different from the first insulating layer, and the method further comprises:

removing the plurality of second layers to form a plurality of concave portions; and forming a plurality of electrode layers in the plurality of concave portions.

18. The method of claim 16, wherein the first and the second regions are formed by forming the lower region, forming the first region on the lower region, and forming the upper region on the first region.

19. The method of claim 16, wherein the first and the second regions are formed using a first gas including carbon.

20. The method of claim 19, wherein a flow rate of the first gas in forming the second region is set smaller than a flow rate of the first gas in forming the first region.

21. The method of claim 19, wherein the first gas includes one or more of CO, $CO_2$, $C_XH_Y$, $SiH_3(CH_3)$, $SiH_2(CH_3)_2$, $SiH(CH_3)_3$ and $Si(CH_3)_4$, where C represents carbon, O represents oxygen, H represents hydrogen, Si represents silicon, X represents an integer of 1 to 4, and Y represents an integer of 1 to 4.

22. The method of claim 19, wherein the first and the second regions are formed by using the first gas including carbon, and a second gas including silicon.

23. The method of claim 22, wherein a flow rate of the second gas in forming the second region is set smaller than a flow rate of the second gas in forming the first region.

24. The method of claim 16, wherein a pressure in a chamber, RF power, or a flow rate of an inert gas in forming the second region is set to a value different from a pressure in the chamber, RF power, or a flow rate of the inert gas in forming the first region.

25. The method of claim 16, further comprising forming a plurality of slits extending in the first direction and a third direction in the stacked film;

removing first portions of a plurality of second insulating layers included in the plurality of second layers by wet etching from the plurality of slits to form a plurality of cavities in the stacked film; and forming a plurality of electrode layers in the plurality of cavities, wherein the stacked layer includes a region that is not sandwiched between the plurality of slits, and the wet etching is performed such that second portions of the plurality of second insulating layers remain in the region that is not sandwiched between the plurality of slits.

26. The method of claim 25, wherein the plurality of first layers includes a plurality of first insulating layers.

* * * * *